(12) United States Patent
Kadosh et al.

(10) Patent No.: US 6,300,661 B1
(45) Date of Patent: *Oct. 9, 2001

(54) MUTUAL IMPLANT REGION USED FOR APPLYING POWER/GROUND TO A SOURCE OF A TRANSISTOR AND A WELL OF A SUBSTRATE

(75) Inventors: Daniel Kadosh, Austin; Mark I. Gardner, Cedar Creek; Michael P. Duane, Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,509

(22) Filed: Apr. 14, 1998

(51) Int. Cl.⁷ .................................................. H01L 29/76
(52) U.S. Cl. ........................... 257/371; 257/928; 257/382
(58) Field of Search .................................. 257/371, 928, 257/382, 754

(56) References Cited

U.S. PATENT DOCUMENTS

| | | | |
|---|---|---|---|
| 4,159,561 | * 7/1979 | Dingwall | 257/372 |
| 4,905,073 | * 2/1990 | Chen et al. | 257/371 |
| 5,243,213 | * 9/1993 | Miyazawa et al. | 257/928 |

* cited by examiner

Primary Examiner—Mark V. Prenty
(74) Attorney, Agent, or Firm—Kevin L. Daffer; Conley, Rose & Tayon P.C.

(57) ABSTRACT

An integrated circuit fabrication process is provided for forming, a mutual implant region within a well which is shared by a source region of a transistor residing within the well and a well-tie region coupled to the well, thereby providing a single electrical link to the well and the source region. Contacts may be coupled to the mutual implant region, and a conductor may be connected to the contacts. In the instance that the well is a p-type well in which NMOS transistors are formed, a ground voltage may be applied to the conductor to bias both the source region and the well. On the other hand, if the well is an n-type well in which PMOS transistors are formed, a power voltage, VCC, may be applied to the conductor to bias both the source region and the well. Absent the need to form contacts to both the source region and the well-tie region and conductors to such contacts, less space is required to bias the well and the source region. Also, merging a portion of the well-tie region with a portion of the source region affords increased packing density of an integrated circuit. The higher packing density is achieved without resorting to decreasing the dimensions of the well-tie region, and thus without detrimentally increasing the resistance of the well-tie region.

14 Claims, 6 Drawing Sheets

MUTUAL IMPLANT REGION USED FOR APPLYING POWER/GROUND TO A SOURCE OF A TRANSISTOR AND A WELL OF A SUBSTRATE

BACKGROUND OF THE INVENTION

1. Field of the Invention

This invention relates to integrated circuit fabrication and, more particularly, to a mutual implant region formed within a well which is shared by a source region of a transistor and a well-tie region coupled to the well, thereby providing high integration density for the integrated circuit.

2. Description of the Related Art

The structure and the various components, or features, of a metal oxide semiconductor ("MOS") device are generally well known. A MOS transistor typically comprises a date conductor spaced above a semiconductor substrate by a gate dielectric. The gate conductor is typically patterned from a layer of polysilicon using various lithography techniques. The substrate generally comprises a lightly doped monolithic silicon-based wafer. The gate conductor serves to self-align impurities forwarded into the substrate on opposite sides of the gate conductor. The impurities placed into the substrate define junctions which are also known as source/drain regions. A "well" which is doped opposite the bulk substrate may exist within a portion of the substrate to accommodate junctions of an impurity type opposite that of the junctions formed in the non-well areas. A typical n-channel MOS ("NMOS") transistor employs n-type junctions placed into a p-type substrate or a p-type well of an n-type substrate. Conversely, a typical p-channel MOS ("PMOS") transistor comprises p-type junctions placed into an n-type substrate or an n-type well of a p-type substrate. Wells are often employed when both n-type and p-type transistors are needed to form a complementary MOS ("CMOS") circuit.

Fabrication of an integrated circuit involves placing numerous multiple-input logic devices above and within a semiconductor substrate. Different logic devices employ different configurations of MOS transistors. FIG. 1 depicts an exemplary logic device known as the NAND gate in symbolic form. Although FIG. 1 shows the NAND gate as having only two inputs, $A_{IN}$ and $B_{IN}$, a NAND gate may have several inputs. FIG. 2 depicts the circuit diagram of the NAND gate in FIG. 1. As shown, the NAND gate includes a pair of PMOS transistors 10 connected in parallel and a pair of NMOS transistors 12 connected in series. The source of the lower-most transistor 12 is connected to ground, and the source of each transistor 10 is connected to a VCC voltage, i.e., a power source.

FIG. 3 illustrates a cross-sectional view of a portion of a NAND gate which embodies NMOS series-connected transistors 12. A p-type well 16 resides within an n-type substrate 14. Well 16 is bounded between trench isolation structures 17. A p-type implant region 18 is arranged within well 16. Implant region 18 has been implanted with a higher concentration of p-type species (often referred to as a $p^+$ implant) than has well 16. Implant region 18 thusly formed is often referred to as a "well-tie" implant region which serves as a low resistive path from a contact 28 to well 16. A source region 20 of one transistor 12 is laterally spaced from implant region 18 and from a common source/drain region 22 shared by both transistors 12. Source/drain region 22 functions as a drain for one transistor and as a source for another transistor of the series-connected transistors 12. A drain region 24 of the other transistor 12 is laterally spaced from source/drain region 22 within well 16.

An interlevel dielectric 26 which serves to isolate transistors 12 extends across the transistors and substrate 14. Contacts 28, 30, and 32 which comprise a conductive material extend vertically through a portion of interlevel dielectric 26 to implant region 18, source region 20, and drain region 24, respectively. Ground conductors 34 and 35 extend horizontally across interlevel dielectric 26, electrically linking contacts 28 and 30 to ground. Coupling well-tie implant region 18 to ground conductor 34 affords biasing p-well 16 to ground, and thereby inhibits forward biasing the p-well, and thereby prevents current from flowing from well 16 to the bulk of substrate 14. Otherwise, current might inadvertently flow from well 16 to other devices residing in substrate 14, rendering the integrated circuit inoperable. Applying ground voltage to source region 20 biases the source region relative to source/drain region 22. Assuming that the gate-to-source voltages of n-channel transistors 12 exceed the transistor threshold voltage for each respective transistor, biasing source 20 will allow adequate gate voltages to cause drive current to flow from drain region 24 to source region 20. An output conductor 36 into which the drive current (i.e., load sink current) of the NAND gate may be measured is connected to drain region 24 through contact 32.

A pervasive trend in modern integrated circuit manufacturing is to produce more complex integrated circuits which operate at higher frequencies (i.e., quickly transition between logic states). Unfortunately, the packing density of an integrated circuit limits the amount of complexity that can be achieved for an integrated circuit. While the well-tie implant region is a critical feature of an integrated circuit which employs wells, it undesirably occupies valuable space within a substrate and/or well of limited lateral area. Moreover, the contact and conductor coupled to the well-tie region increase the amount of space required to bias a well. While reducing the sizes of the contact and the conductor would increase the packing density of the integrated circuit, this is not possible because of the limitations of optical lithography. It is well known that the dimensions of features, e.g., contacts and conductors, patterned using lithography cannot be reduced beyond a lower limit. Also, decreasing the lateral area occupied by a well-tie region is not a viable option because doing so would lead to an undesirable increase in the resistance of the well-tie region.

It would therefore be of benefit to develop a technique for reducing the amount of space required to bias a well residing within a semiconductor substrate. That is, the lateral area occupied by only the well-tie region within the well needs to be reduced. However, to avoid an unwanted increase in the resistance to the pathway of current flowing from a contact coupled to the well-tie region to the well, the dimensions of the well-tie region itself cannot be reduced significantly. Moreover, it would also be desirable to reduce the amount of space occupied by the contact and the conductor connected to the well-tie region. Absent the ability to reduce the dimensions of the contact and the cconductor, other measures must be taken to increase the packing density of those elements within the integrated circuit. Therefore, it would be beneficial to improve the layout scheme of conventional well and source contacts by merging the well-tie region, the contact coupled to the well-tie region, and the conductor connected to the contact with other elements of an integrated circuit. Decreasing the space occupied by only those elements used to bias the well would advantageously improve the packing density of the integrated circuit, providing for higher circuit complexity.

SUMMARY OF THE INVENTION

The problems outlined above are in large part solved by the technique hereof for forming a mutual implant region within a well which is shared by a source region of a transistor residing within the well and a well-tie region coupled to the well. According to a preferred embodiment, a single electrical link is provided to the well and the source region. Several contacts may be coupled to the mutual implant region, and a conductor may be connected to the contacts. In the instance that the well is a p-type well in which NMOS transistors are formed, the conductor may be, rounded to bias both the source region and the well. On the other hand, if the well is an n-type well in which PMOS transistors are formed, a power voltage, VCC, may be applied to the conductor to bias both the source region and the well. Absent the need to form contacts to both the source region and the well-tie region and conductors to such contacts, less space is required to bias the well and the source region. Also, merging a portion of the well-tie region with a portion of the source region affords increased packing density of the ensuing integrated circuit. Advantageously, the high packing density is achieved without resorting to minimizing the dimensions of the well-tie region, and thus without detrimentally increasing the resistance of the well-tie region.

In an embodiment of the present invention, a well residing in a semiconductor substrate doped opposite the bulk substrate is provided. A conductive layer comprising, e.g., polycrystalline silicon ("polysilicon"), is then formed across the semiconductor substrate. The conductive layer is patterned to form a gate conductor upon the well. A source/drain implant which is self-aligned to the opposed sidewall surfaces of the gate conductor may be forwarded into the substrate. In this manner, source and drain regions for a PMOS or NMOS transistor are formed within the well. A masking layer is formed across the gate conductors, the drain region, and a portion of the source region. A dopant species of the same type as the dopant species positioned within the well is then implanted into a select region of the well to form a well-tie region coupled to the well. The concentration of dopant species implanted into the well-tie region is greater than that of the dopant species arranged within the well so as to produce a low resistance pathway to the well. The source region overlaps a portion of the well-tie region, creating a mutual implant region. In one embodiment, another transistor configured in parallel or in series with the transistor having the shared source region may also be formed within the well.

Subsequent to forming the well-tie region and the transistors within the well, a low resistivity suicide may be formed upon the well-tie region, the mutual implant region, and the source and drain regions. An interlevel dielectric is then deposited across the semiconductor topography to a level spaced above the gate conductors to isolate the transistors from each other and from overlying levels of the ensuing integrated circuit. Conductive contacts are formed through the interlevel dielectric to the mutual implant region. Advantageously, the contacts formed to the mutual implant region are coupled to both the well-tie region and the source region. Contacts may also be formed through the interlevel dielectric to the source and drain regions of the transistors other than the shared source region. Horizontally extending conductors which abut the contacts may be formed within the interlevel dielectric. In one embodiment in which a p-type well and NMOS transistors residing in the well are fabricated, a ground conductor may be coupled to the mutual region. The ground conductor may be grounded to simultaneously bias the shared source region and the well-tie region which is coupled to the well. In another embodiment in which an n-type well and PMOS transistors are formed, a power conductor may be coupled to the mutual region. A power source, VCC, may be supplied to the power conductor to bias both the shared source region and the well-tie region, and hence the well.

BRIEF DESCRIPTION OF THE DRAWINGS

Other objects and advantages of the invention will become apparent upon reading the following detailed description and upon reference to the accompanying drawings in which.

Figure 1:
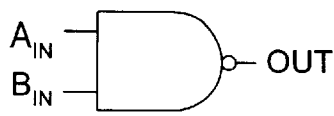
FIG. 1 depicts a logic level diagram of a NAND gate according to conventional design.
Figure 2:
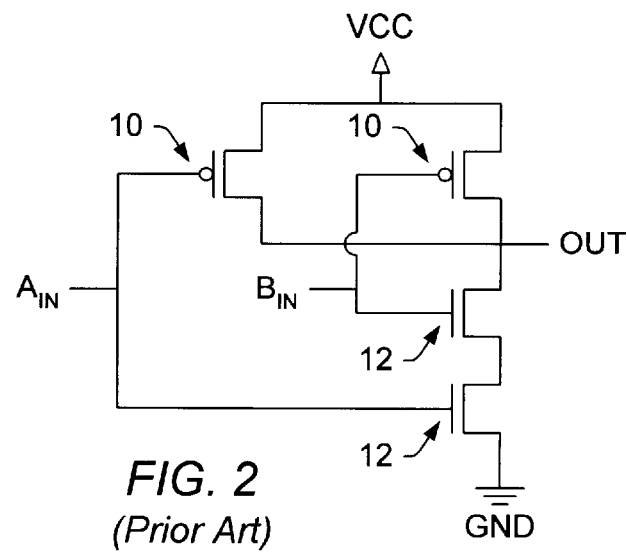
FIG. 2 depicts a circuit level diagram corresponding to the logic level diagram of FIG. 1 in which the NAND gate includes a pair of parallel-connected PMOS transistors and a pair of series-connected NMOS transistors.
Figure 3:
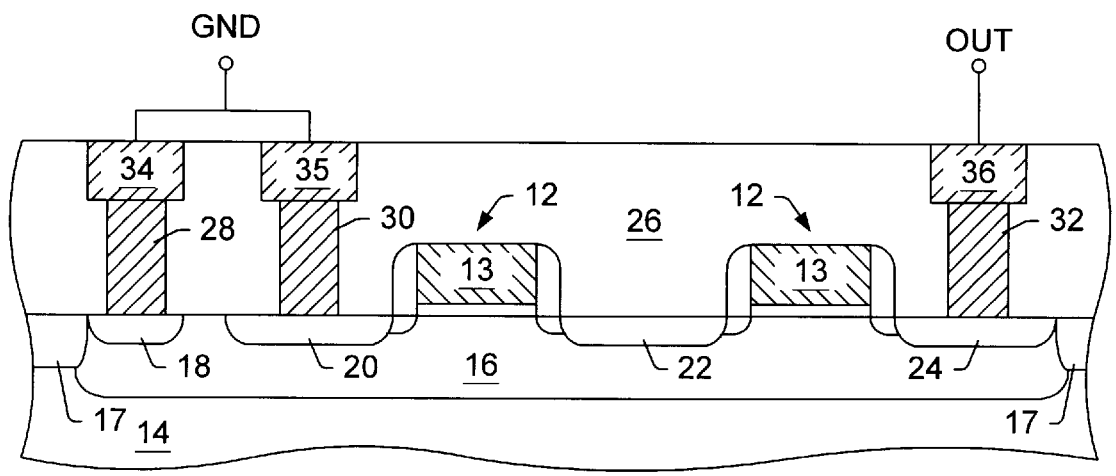
FIG. 3 is a cross-sectional view of a semiconductor topography embodying the pair of series-connected transistors depicted in FIG. 2.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4A:
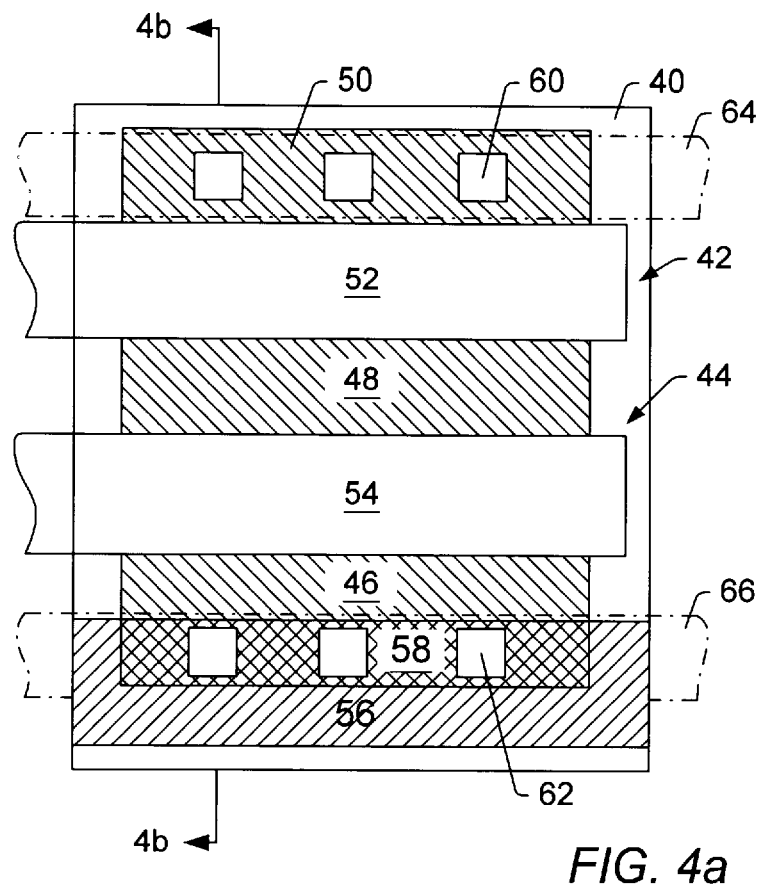
FIG. 4a is a top layout view of a semiconductor topography comprising a pair of series-connected transistors, wherein a mutual implant region is shared by a well-tie region coupled to a well and a source region of one transistor residing within the well.

FIG. 4a depicts a top layout view of a semiconductor topography according to an embodiment of the present invention. A well 40 arranged within a semiconductor substrate is shown. A pair of series-connected transistors 42 and 44 are formed upon and within well 40. A source/drain region 48 implanted into well 40 is shared by both transistors 42 and transistor 44. Source/drain region 48 functions as the drain of transistor 44 and the source of transistor 42. Transistor 42 also includes a drain region 50 implanted into well 40 and a gate conductor 52 arranged above a region of well 40 interposed between source/drain region 48 and drain region 50. Transistor 44 comprises a source region 46 which partially overlaps a well-tie region 56 residing within well 40. Thus, a mutual implant region 58 which is shared by source region 46 and well-tie region 56 resides within well 40. Since source region 46 overlaps well-tie region 56, less lateral area within well 40 is required for the two regions than if they were separated from each other. Transistor 44 also includes a gate conductor 54 arranged above well 44 a spaced distance from well-tie region 58. Contacts 62 extend vertically between mutual implant region 58 and an overlying horizontally extending conductor 66. As such, a voltage may be applied to conductor 66 which is coupled to both source region 46 and well-tie region 56 by mutual implant region 58. Contacts 60 are also formed between drain region 50 and an overlying conductor 64.

Figure 4B:
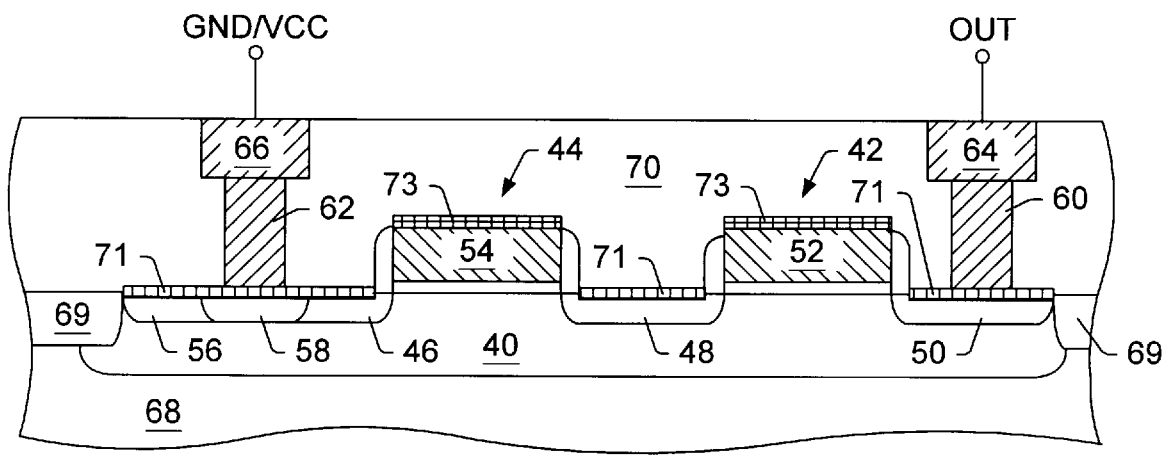
FIG. 4b is a cross-sectional view along plane 4b of FIG. 4a, wherein a ground or power source is applied to a conductor electrically linked to the mutual implant region.

FIG. 4b is a cross-sectional view along plane 4b of FIG. 4a. Well 40 is arranged within a semiconductor substrate 68. Trench isolation structures 69 are positioned at the lateral boundaries of well 40. Alternately, trench isolation structures 69 may be replaced with well-known LOCOS isolation structures. Well 40 is oppositely doped relative to substrate 68. Well-tie region 56 is doped with the same type of dopant as well 40. However, the dopant concentration within well-tie region 56 is greater than that within well 40. Source region 46, source/drain region 48, and drain region 50 comprise a relatively hi,h concentration of dopant species opposite in type to the dopant species in well 40 and well-tie region 56. Accordingly, mutual implant region 58 is heavily doped with both types of dopant species, i.e., n-type species and p-type species. In one embodiment, well 40 may be a p-type well having NMOS transistors 42 and 44 residing therein. In this instance, FIGS. 4a and 4b depict a portion of, e.g., a NAND gate. In another embodiment, well 40 may be an n-type well having PMOS transistors 42 and 44 residing, therein. In this case, FIGS. 4a and 4b may depict a portion of, e.g., a NOR gate.

Silicide structures 71 are formed upon well-tie region 56, mutual implant region 58, source region 46, source/drain region 48, and drain region 50. Silicide structures 71 provide low resistivity contact regions at the interfaces between contact 62 and mutual implant region 58 and between contact 60 and drain region 50. Silicide structures 73 may also reside upon the upper surfaces of gate conductors 54 and 52. Conductor 66 may effectuate either a ground conductor or a power conductor. That is, during operation of an ensuing, integrated circuit, a ground supply or a power supply, VCC, may be supplied to conductor 66 to bias both source region 46 and well-tie region 56 which is coupled to well 40. If well 40 is a p-type well, ground is applied, and if well 40 is an n-type well, VCC is applied. Conductor 64 may function as an output conductor in that any current flowing from source region 46 to drain 50 may be measured from conductor 64. An interlevel dielectric 70 which serves to isolate transistors 44 and 42 is arranged across the semiconductor topography.

Figure 5:
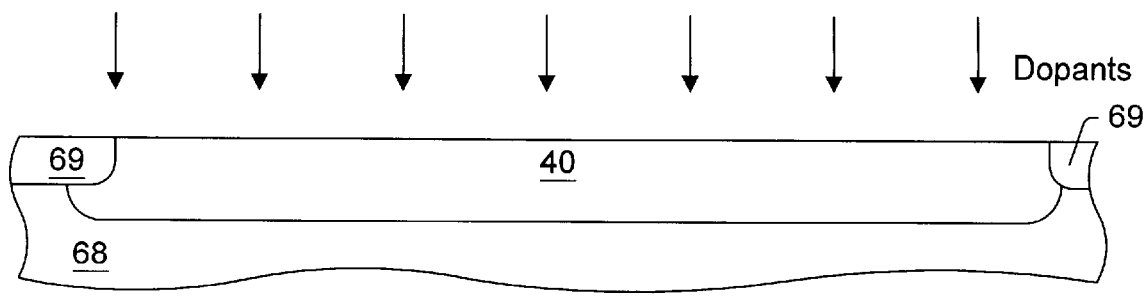
FIG. 5 depicts a processing step used to form the semiconductor topography of FIG. 4b, wherein a first type of dopant species is implanted into a semiconductor substrate to form a well.
Figure 6:
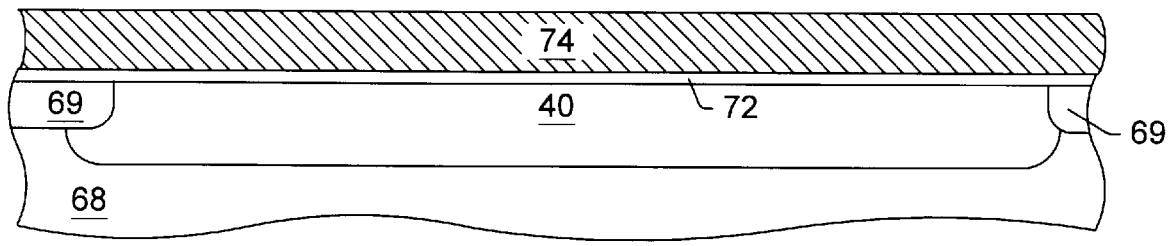
FIG. 6 depicts a processing step used to form the semiconductor topography of FIG. 4b, wherein a gate dielectric is formed across the substrate and a gate conductor material is deposited across the gate dielectric, subsequent to the step in FIG. 5.
Figure 7:
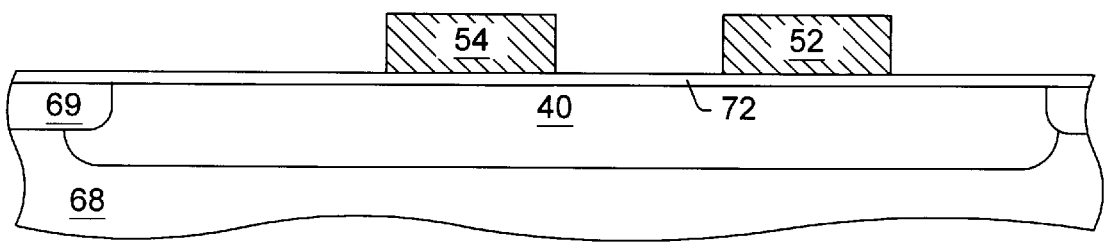
FIG. 7 depicts a processing step used to form the semiconductor topography of FIG. 4b, wherein a pair of gate conductors are patterned from the gate conductor material a lateral spaced distance apart upon the semiconductor substrate, subsequent to the step in FIG. 6.

FIGS. 5–13 illustrate a sequence of steps which may be performed to form the semiconductor topography depicted in FIGS. 4a and 4b. Turning to FIG. 5, a single crystalline silicon substrate 68 is depicted which is slightly doped with p-type or n-type dopant species. Dopant species opposite in type to those residing within bulk substrate 68 are implanted into a portion of substrate 68 to form a well 40 therein. Trench isolation structures 69 comprising a dielectric, e.g., silicon dioxide ("oxide"), may be formed within substrate 68 proximate the lateral boundaries of well 40. Alternately, trench isolation structures 69 may be substituted with LOCOS isolation structures. As shown in FIG. 6, a gate dielectric 72 is formed across the surface of substrate 68. Gate dielectric 72 may, e.g., comprise a thermally grown oxide which is formed by heating substrate 68 while in an oxygen-bearing ambient. A gate conductor material 74 is deposited across gate dielectric 72. Gate conductor material 74 is preferably chemically-vapor deposited ("CVD") from, e.g., a silane source, and thus preferably comprises polysilicon. The composition of gate conductor material 74 is not limited to polysilicon and may also be composed of other semiconductive or conductive materials, such as tungsten and aluminum. As depicted in FIG. 7, select portions of gate conductor material 74 may be removed to define a pair of gate conductors 52 and 54 which are laterally spaced apart from each other. Those portions of gate conductor material 74 may be removed by first patterning photoresist across the gate conductor material exclusive of upon those select portions. Those portions of gate conductor material 74 not covered by the photoresist may then be etched away using, e.g., a dry, plasma etch technique.

Figure 8:
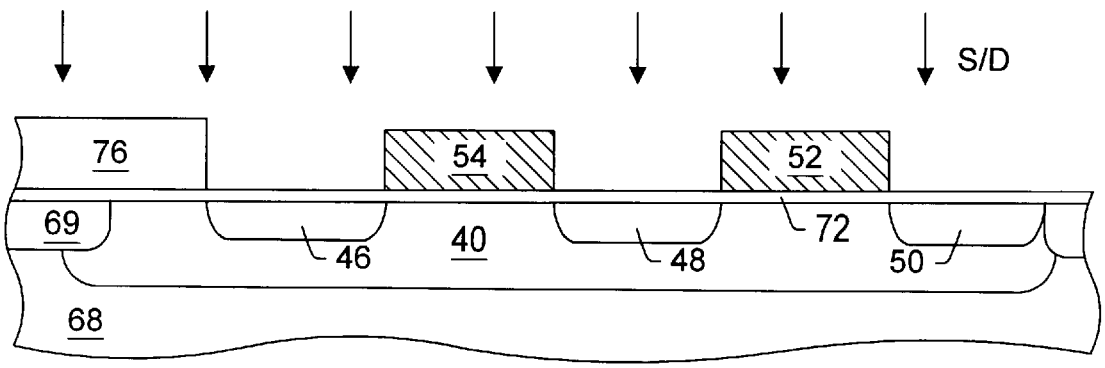
FIG. 8 depicts a processing step used to form the semiconductor topography of FIG. 4b, wherein a masking layer is formed across a select portion of the substrate and a source/drain implant which is self-aligned to the opposed sidewall surfaces of the gate conductors is forwarded into the well to form source/drain regions; subsequent to the step in FIG. 9.

As shown in FIG. 8, a masking layer 76 comprising, e.g., photoresist may then be patterned above a select portion of substrate 68 a lateral spaced distance from gate conductor 54. Subsequently, a source/drain implant of dopant species which are opposite in type to those previously implanted into well 40 are forwarded into unmasked areas of well 40.

That is, if NMOS transistors are being formed, n-type species are implanted, and if PMOS transistors are being formed, p-type species are implanted. Some commonly used p-type species are boron and boron difluoride, and some commonly used n-type dopants are arsenic and phosphorus. Gate dielectric 72 provides adequate distribution of the implanted species. Gate conductors 52 and 54 serve as masks during the implantation step, thereby inhibiting dopant species from passing into channel regions of well 40 residing beneath the gate conductors. The dopant species that become positioned within gate conductors 52 and 54 may render the gate conductors conductive if they comprise polysilicon. Further, masking layer 76 prevents dopant species from passing into the underlying portion of well 68. As a result of the source/drain implant, a source region 46 is formed for one transistor, a drain region 50 is formed for another transistor, and a source/drain region 48 shared by the two series-connected transistors is formed within well 40. Masking layer 76 may be stripped from the semiconductor topography after the source/drain implant.

Figure 9:
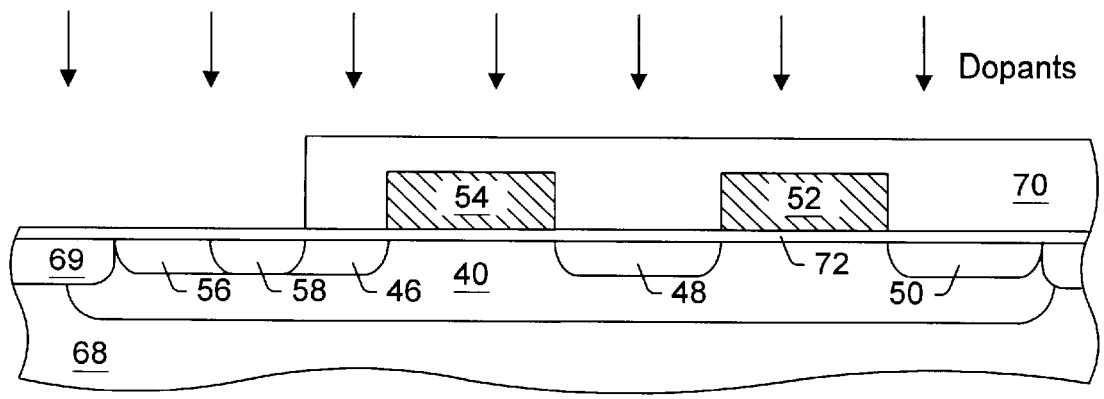
FIG. 9 depicts a processing step used to form the semiconductor topography of FIG. 8, wherein a masking layer is formed across the gate conductors, the drain region, and a portion of the source region, followed by implanting a higher concentration of the first type of dopant species into an exposed region of the well to form a well-tie region and a mutual implant region shared by the well-tie region and the source region, subsequent to the step in FIG. 5.

Turning to FIG. 9, a masking layer 70 comprising, e.g., photoresist, may be patterned across gate conductors 52 and 54, drain region 50, source/drain region 48, and a portion of source region 46 using optical lithography. Masking layer 70 is not limited to photoresist and may include any material since the masking layer is sacrificial in that it will be removed. If masking layer 70 is not photoresist, it may be patterned using both lithography and an etch technique. The same type of dopant species as those previously implanted into substrate 68 may then be forwarded into an exposed portion of well 40 to form a well-tie region 56. The implant used to form well-tie region 56 is preferably performed at a higher dose and lower energy than the implant used to form well 40. As such, well-tie region 56 contains a higher concentration of dopant and is shallower than well 40. Well-tie region 56 partially overlaps source region 46. A mutual implant region 58 is thusly formed which is common to both well-tie region 56 and a source region 46. Concurrent with implanting dopant species into well-tie region 56, the dopant species are also implanted into other well regions of substrate 68 which are doped opposite to well 40. As a result, source and drain regions for other transistors of the integrated circuit are formed to effectuate a CMOS circuit which includes both NMOS transistors residing in p-type wells and PMOS transistors residing in n-type wells.

Figure 10:
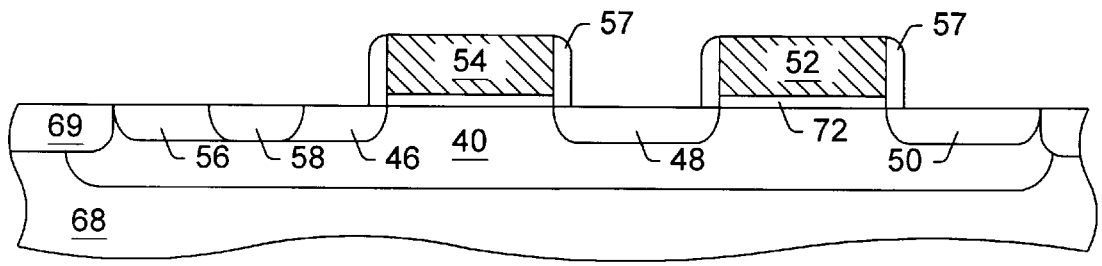
FIG. 10 depicts a processing step used to form the semiconductor topography of FIG. 4b, wherein dielectric sidewall spacers are formed which extend laterally from the opposed sidewall surfaces of the gate conductors, subsequent to the step in FIG. 9.

Turning to FIG. 10, subsequent to removing masking layer 70, dielectric sidewall spacers 57 are formed which extend laterally from the opposed sidewall surfaces of gate conductors 52 and 54. Sidewall spacers 57 may be formed by first CVD depositing a dielectric, e.g., silicon dioxide, silicon nitride, or silicon oxynitride, across the semiconductor topography. The dielectric is then subjected to an anisotropic etch which occurs at a faster rate in a vertical direction than in a horizontal direction. The etch duration is chosen to terminate after the dielectric has been removed from horizontally oriented surfaces such that the dielectric is only retained upon the vertically oriented sidewall surfaces of gate conductors 52 and 54. Preferably, the etch duration is chosen to terminate before substantial portions of substrate 68 can be removed such that gate dielectric 72 is removed from the substrate exclusive of gate conductors 52 and 54. In this manner, a portion 55 of the dielectric is removed while dielectric sidewall spacers 57 are retained upon the opposed sidewall surfaces. Alternately, dielectric sidewall spacers 57 may be formed prior to performing the source/drain implant depicted in FIG. 9. As such, a lightly doped drain ("LDD") implant which is self-aligned to the opposed sidewall surfaces of gate conductors 52 and 54 may be forwarded into well 40 subsequent to forming masking layer 76 and before forming sidewall spacers 57. The LDD implant is preferably formed at a lower dose and energy than the source/drain implant. If the source/drain implant is performed after the formation of sidewall spacers 57, the source/drain implant will be self-aligned to the exposed lateral surfaces of the spacers. As such, junctions 46, 48, and 50 will be graded such that the dopant concentration decreases in a lateral direction toward the gate conductors.

Figure 11:
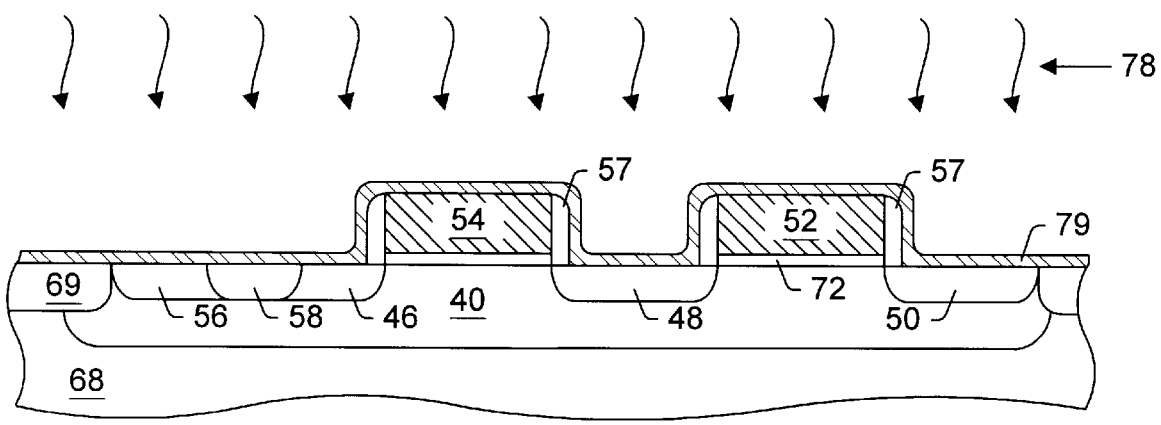
FIG. 11 depicts a processing step used to form the semiconductor topography of FIG. 4b, wherein a refractory metal is deposited across the topography and subjected to a heat cycle to initiate reaction between silicon-based surfaces and the metal to form metal suicide, subsequent to the step in FIG. 10.
Figure 12:
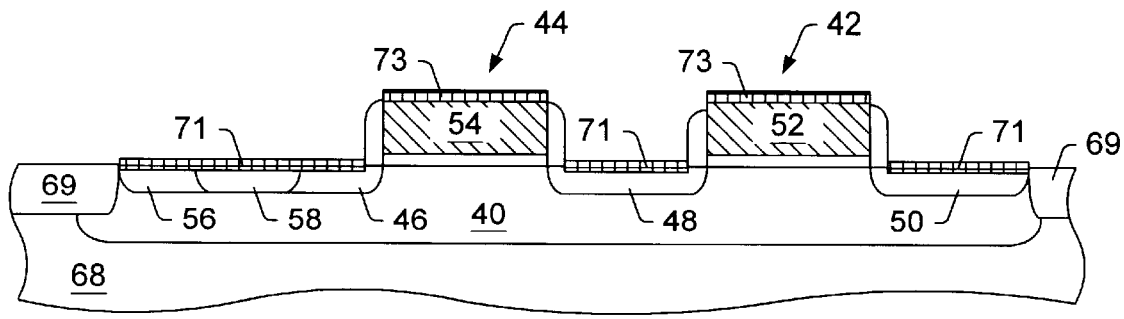
FIG. 12 depicts a processing step used to form the semiconductor topogaraphy of FIG. 4b, wherein unreacted metal has been removed from the topography to form metal silicide exclusively upon silicon-based surfaces, subsequent to the step in FIG. 11.

FIGS. 11–12 illustrate the formation of silicide structures 71 upon well-tie region 56, mutual implant region 58, source region 46, source/drain region 48, and drain region 50 and of polycide structures 73 upon the upper surfaces of gate conductors 52 and 54. As shown in FIG. 11, a refractory metal 79, eg., titanium or cobalt, is deposited across the semiconductor topography using either sputter deposition from a metal target or metal organic chemical vapor deposition ("MOCVD") from a gas comprising a metal organic-containing compound. Sidewall spacers 57 are strategically placed laterally adjacent the sidewall surfaces of gate conductors 52 and 54 to inhibit refractory metal 79 form contacting the gate conductors. Metal 79 is then exposed to a form of radiation 78 supplied from either an annealing furnace or a Rapid Thermal Anneal ("RTA") chamber. As a result of being subjected to a heat cycle, metal 79 reacts with underlying silicon of substrate well 40 and polysilicon gate conductors 52 and 54 to form a metal silicide. Unreacted portions of refractory metal 79 are then removed using an etch technique which is highly selective to the metal. Consequently, self-aligned silicide (i.e., salicide) structures 71 are formed exclusively well 40 and polycide structures 73 are formed exclusively upon the upper surfaces of gate conductors 52 and 54, as shown in FIG. 12.

Figure 13:
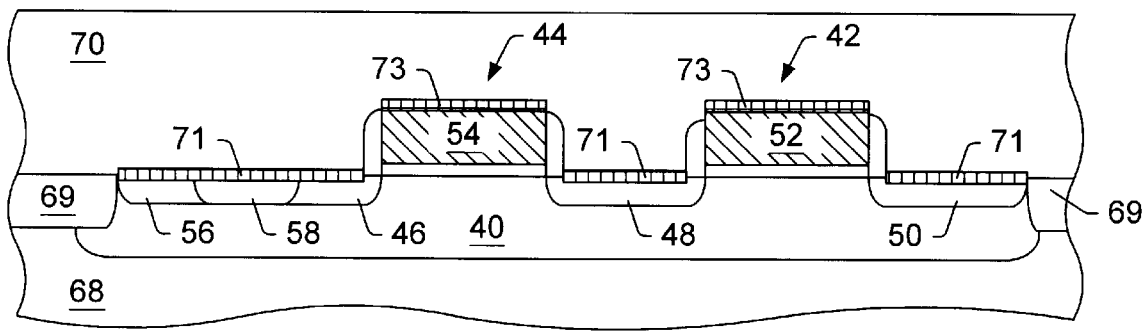
FIG. 13 depicts a processing step used to form the semiconductor topography of FIG. 4b, wherein an interlevel dielectric is formed across the topography, subsequent to the step in FIG. 12.

Subsequently, an interlevel dielectric 70 may be formed across the semiconductor topography, as shown in FIG. 13. Interlevel dielectric 70 may comprise a CVD deposited dielectric. For example, interlevel dielectric 70 may be LPCVD deposited from a TEOS source across the semiconductor topography. Alternately, interlevel dielectric 70 may comprise a spin-on deposited dielectric, e.g., spin-on-glass. The upper surface of interlevel dielectric 70 is substantially planarized using, e.g., chemical-mechanical polish or sacrificial etchback. Openings may be etched entirely through select portions of interlevel dielectric 70 using, e.g., a plasma (anisotropic) etch technique. A conductive material, e.g., tungsten or titanium, may be deposited into the opening,s to form the contacts 62 and 60 depicted in FIG. 4b. Trenches may also be etched horizontally across interlevel dielectric 70 and above contacts 62 and 60. Those trenches may be filled with a conductive material, e.g., copper or aluminum, to form conductors 66 and 64.

Figure 14A:
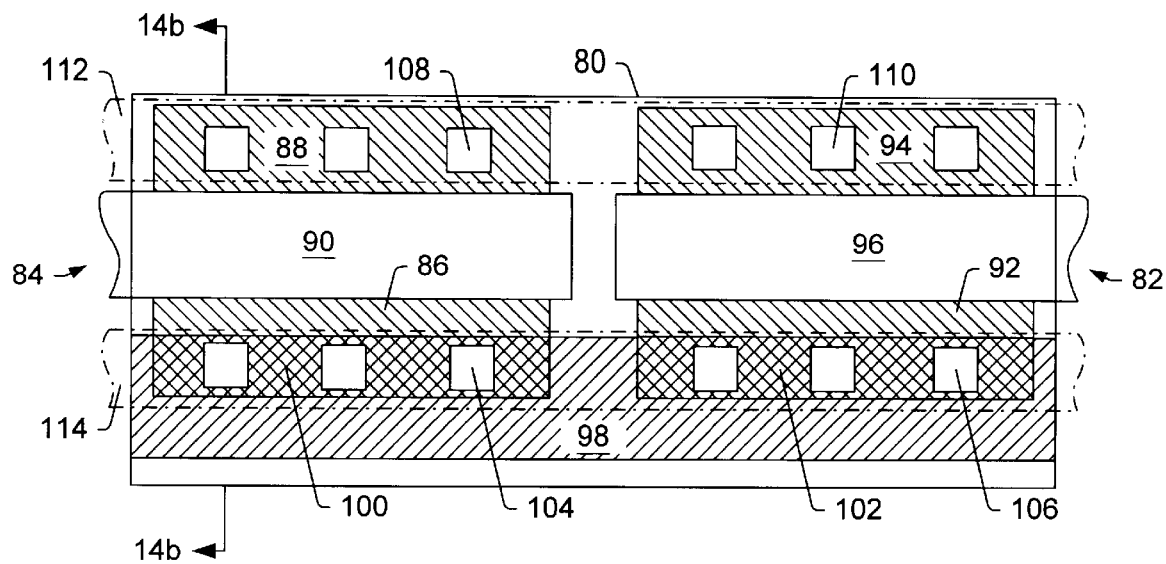
FIG. 14a is a top layout view of a semiconductor comprising a pair of parallel-connected transistors, wherein a mutual implant region of each transistor is shared by a well-tie region coupled to a well and source regions of transistors residing within the well.

FIG. 14a depicts a top layout view of a semiconductor topography according to another embodiment of the present invention. A well 80 residing within a semiconductor substrate is depicted. A pair of parallel-connected transistors 82 and 84 are formed upon and within well 80. Transistor 82 includes a source region 92 which partially overlaps a well-tie region 98 residing within well 80. Therefore, a mutual implant region 102 which is shared by source region 92 and well-tie region 98 is arranged within well 80. Transistor 82 also includes a drain region 94 implanted into well 80 and a gate conductor 96 arranged above a region of well 40 interposed between source region 92 and drain region 94. Moreover, transistor 84 also includes a source region 86 which partially overlaps well-tie region 98. As such, another mutual implant region 100 common to both source region 86 and well-tie region 98 is arranged within well 80.

A drain region 88 of transistor 84 is arranged within well 80 a lateral spaced distance from source region 86. Transistor 84 also includes a gate conductor arranged above the region of well 80 interposed between drain region 88 and source region 86. Although not shown, an isolation structure arranged within the substrate is interposed between transistors 84 and 86 to isolate the transistors. Contacts 104 extend vertically between mutual implant region 100 and an overlying horizontally extending conductor 114. Also, conductor 144 is coupled to mutual implant region 102 via contacts 106. Thus, conductor 114 may be grounded or subjected to a power source to bias source regions 100 and 102 and well-tie region 98 through mutual implant regions 100 and 102. Contacts 108 and 110 couple respective drain regions 88 and 94 to an overlying horizontally extending conductor 112.

Figure 14B:
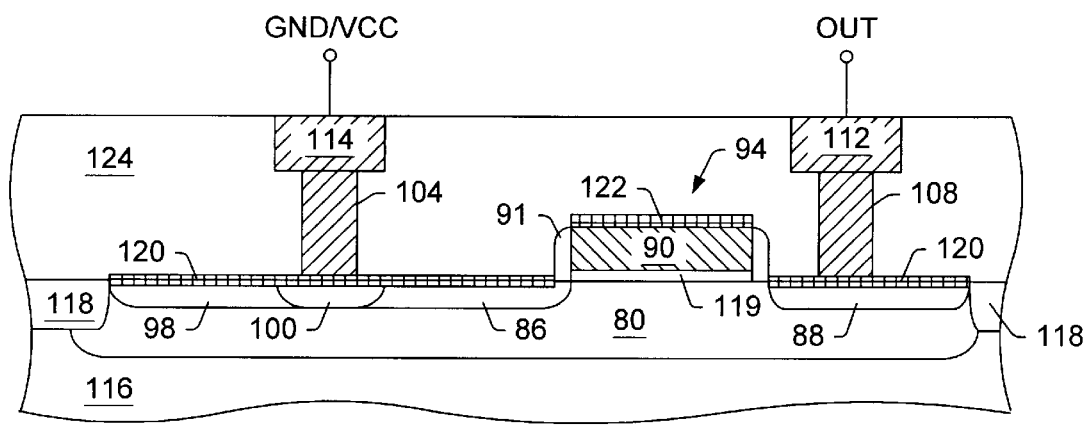
FIG. 14b is a cross-sectional view along plane 14b of FIG. 4a, wherein a ground or power source is supplied to a conductor electrically linked to the mutual implant region.

FIG. 14b is a cross-sectional view along plane 14b of FIG. 14a. Well 80 is arranged within a semiconductor substrate 1 16 comprising slightly doped single crystalline silicon. Trench isolation structures 118 are positioned at the lateral boundaries of well 80. Alternately, trench isolation structures 118 may be replaced with well-known LOCOS isolation structures. Well 80 is oppositely doped relative to substrate 116. Well-tie region 98 is doped with the same type of dopant as well 80. However, the dopant concentration within well-tie region 98 is greater than that within well 80. Source region 86 and drain region 50 comprise a relatively high concentration of dopant species opposite in type to the dopant species in well 80 and well-tie region 98. Accordingly, mutual implant region 100 is heavily doped with both types of dopant species, i.e., n-type species and p-type species. In one embodiment, well 80 may be an n-type well having PMOS transistors 82 and 84 residing therein. In this instance, FIGS. 14a and 14b depict a portion of, e.g., a NAND gate. In another embodiment, well 80 may be a p-type well having NMOS transistors 82 and 84 residing therein. In this case, FIGS. 4a and 4b may depict a portion of, e.g., a NOR gate.

Silicide structures 120 are formed upon well-tie region 98, mutual implant region 100, source region 86, and drain region 88. Silicide structures 120 provide low resistivity contact regions at the interfaces between contact 104 and mutual implant region 100 as well as between contact 108 and drain region 88. Gate conductor 90 is spaced above well 80 by a gate dielectric 119. A silicide (i.e., polycide) structure 122 may also reside upon the upper surface of gate conductor 90. Dielectric sidewall spacers 91 may extend from the opposed sidewall surfaces of ate conductor 90. The sidewall spacers 91 serve to inhibit the formation of silicide laterally adjacent gate conductor 90, and thus prevent a conductive path from forming between gate conductor 90 and source and drain region 86 and 88. In an alternate embodiment, LDD areas may be arranged within well 80 directly underneath spacers 91 such that source and drain regions 86 and 88 are laterally spaced from gate conductor 90. Conductor 114 may effectuate either a ground conductor or a power conductor. That is, during operation of an ensuing integrated circuit, a ground or a a power source, VCC, may be supplied to conductor 114 to bias both source region 86 and well-tie region 98 which is coupled to well 80. If well 80 is a p-type well, conductor 114 is connected to ground, and if well 40 is an n-type well, conductor 14 is connected to a power supply. Conductor 112 may function as an output conductor in that any current flowing from source region 86 to drain 88 may be measured from conductor 112. An interlevel dielectric 124 which serves to isolate transistor 94 is arranged across the semiconductor topography.

It will be appreciated to those skilled in the art having the benefit of this disclosure that this invention is believed to provide a method for forming a transistor having an ultra short channel length dictated by the width of a gate conductor patterned upon a gate dielectric having a relatively high dielectric constant. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising a mutual implant region arranged within a well, wherein the mutual implant region is shared by a single source region of a transistor residing within the well and a single well-tie region residing within the well, wherein the mutual implant region comprises a pair of opposed lateral boundaries, and wherein the source region extends laterally outside one of the lateral boundaries and the well-tie region extends laterally beyond the other of the lateral boundaries, wherein the mutual implant region contains n-type and p-type dopants dispersed throughout the mutual implant region at respective concentrations higher than concentrations of n-type or p-type dopants within the well, and wherein the mutual implant region is wide enough to allow a contact hole through an overlying dielectric to fit between the opposed lateral boundaries.

2. The integrated circuit of claim 1, wherein the well-tie region and the well comprise a first type of dopant species, and wherein the source region comprises a second type of dopant species dissimilar to the first type of dopant species.

3. The integrated circuit of claim 2, wherein the well comprises a first concentration of the first type of dopant species, and wherein the well-tie region comprises a second concentration of the first type of dopant species which is substantially greater than the first concentration.

4. The integrated circuit of claim 2, wherein the first type of dopant species comprises a p-type dopant, and wherein the second type of dopant species comprises an n-type dopant.

5. The integrated circuit of claim 2, wherein the second type of dopant species comprises a p-type dopant, and wherein the first type of dopant species comprises an n-type dopant.

6. The integrated circuit of claim 2, further comprising a drain region residing within the well a lateral spaced distance from the source region, wherein the drain region comprises the second type of dopant species.

7. The integrated circuit of claim 6, further comprising a gate conductor arranged upon a portion of the well interposed between the source region and the drain region.

8. The integrated circuit of claim 6, wherein the drain region is also another source region of another transistor.

9. The integrated circuit of claim 6, further comprising an interlevel dielectric arranged across the well region and a first conductive contact extending through the interlevel dielectric to the mutual implant region.

10. The integrated circuit of claim 9, further comprising a ground conductor extending across the interlevel dielectric and abutting the first conductive contact, wherein the ground conductor is adapted to be grounded.

11. The integrated circuit of claim 9, further comprising, a power conductor extending across the interlevel dielectric and abutting the first conductive contact, wherein the power conductor is adapted to receive a voltage.

12. The integrated circuit of claim 11, further comprising a second conductive contact extending through the interlevel dielectric to the drain region and an output conductor extending across the interlevel dielectric such that the output conductor abuts the second conductive contact.

13. The integrated circuit of claim 1, wherein the well region resides within a semiconductor substrate comprising single crystalline silicon.

14. An integrated circuit comprising:

a mutual implant region arranged within a well, wherein the mutual implant region is shared by a single source region of a transistor residing within the well and a single well-tie region residing within the well, wherein the mutual implant region comprises a pair of opposed lateral boundaries, and wherein the source region extends laterally outside one of the lateral boundaries and the well-tie region extends laterally beyond the other of the lateral boundaries, and wherein the mutual implant region contains n-type and p-type dopants dispersed throughout the mutual implant region at respective concentrations higher than concentrations of n-type or p-type dopants within the well;

an insulating layer arranged over the mutual implant region and the well; and a contact structure extending through the insulating layer to make electrical contact to the mutual implant region, wherein a lower surface of the contact structure is laterally aligned within the mutual implant region.

* * * * *